(12) United States Patent
Zuo

(10) Patent No.: US 10,147,837 B2
(45) Date of Patent: Dec. 4, 2018

(54) MONOCRYSTAL AND POLYCRYSTAL TEXTURING METHOD

(71) Applicant: CHANGZHOU S.C EXACT EQUIPMENT CO., LTD., Changzhou, Jiangsu Province (CN)

(72) Inventor: Guojun Zuo, Changzhou (CN)

(73) Assignee: CHANGZHOU S.C EXACT EQUIPMENT CO., LTD., Changzhou, Jiangsu Province (CN)

( * ) Notice: Subject to any disclaimer, the term of this patent is extended or adjusted under 35 U.S.C. 154(b) by 0 days.

(21) Appl. No.: 15/866,756

(22) Filed: Jan. 10, 2018

(65) Prior Publication Data

US 2018/0130922 A1    May 10, 2018

Related U.S. Application Data

(63) Continuation of application No. PCT/CN2015/097415, filed on Dec. 15, 2015.

(30) Foreign Application Priority Data

Oct. 12, 2015  (CN) .......................... 2015 1 0656294

(51) Int. Cl.
*H01L 31/18*     (2006.01)
*H01L 31/0236*   (2006.01)
(Continued)

(52) U.S. Cl.
CPC ............ *H01L 31/182* (2013.01); *C30B 29/06* (2013.01); *C30B 33/10* (2013.01); *C30B 35/00* (2013.01); *H01L 31/02363* (2013.01)

(58) Field of Classification Search
None
See application file for complete search history.

(56) References Cited

U.S. PATENT DOCUMENTS

| 6,197,611 B1* | 3/2001 | Nishimoto ........ H01L 21/30608 136/256 |
| 2009/0038682 A1* | 2/2009 | Komatsu ........... H01L 31/02363 136/258 |

(Continued)

FOREIGN PATENT DOCUMENTS

| CN | 103151423 A | 6/2013 |
| CN | 103413759 A | 11/2013 |

(Continued)

OTHER PUBLICATIONS

International Search Report of PCT/CN2015/097415, dated Jul. 14, 2016.

*Primary Examiner* — Asok K Sarkar
(74) *Attorney, Agent, or Firm* — Locke Lord LLP; Tim Tingkang Xia, Esq.

(57) ABSTRACT

A monocrystal and polycrystal texturing method, includes: 1: placing a silicon wafer in an acid liquid, where the acid liquid reacts with the surface of the silicon wafer to conduct acid corrosion; 2: washing the silicon wafer after acid corrosion by water and then drying the silicon wafer; 3: uniformly spreading an alkali liquid on the silicon wafer, where the alkali liquid reacts with the surface of the silicon wafer to conduct alkali corrosion; 4: washing the silicon wafer after alkali corrosion by water; 5: placing the silicon wafer in alkali solution for alkali washing; 6: washing the silicon wafer by water; 7: washing the silicon wafer by acid solution; and 8: washing the silicon after acid washing by water and then drying the silicon wafer. Steps 1 to 8 are conducted during monocrystal texturing, and steps 1 to 2 and steps 5 to 8 are conducted during polycrystal texturing.

6 Claims, 3 Drawing Sheets

(51) Int. Cl.
*C30B 33/10* (2006.01)
*C30B 29/06* (2006.01)
*C30B 35/00* (2006.01)

(56) References Cited

U.S. PATENT DOCUMENTS

| | | | | |
|---|---|---|---|---|
| 2010/0029034 A1* | 2/2010 | Nishimoto | ........ | H01L 31/02363 438/71 |
| 2012/0296447 A1* | 11/2012 | Diller | ................ | H05B 37/0245 700/9 |
| 2013/0291925 A1* | 11/2013 | Okuuchi | ........... | H01L 31/02363 136/246 |
| 2013/0295712 A1* | 11/2013 | Chen | ................ | H01L 31/02363 438/71 |
| 2014/0057383 A1* | 2/2014 | Okuuchi | ........... | H01L 31/02363 438/71 |
| 2014/0238487 A1* | 8/2014 | Okuuchi | ........... | H01L 31/02363 136/258 |
| 2015/0014580 A1* | 1/2015 | Nakagawa | ........ | H01L 31/02363 252/79.5 |
| 2016/0099360 A1* | 4/2016 | Okuuchi | ........... | H01L 31/02363 438/71 |

FOREIGN PATENT DOCUMENTS

| | | |
|---|---|---|
| CN | 103426736 A | 12/2013 |
| CN | 103924305 A | 7/2014 |
| CN | 103981575 A | 8/2014 |
| CN | 104630900 A | 5/2015 |

* cited by examiner

MONOCRYSTAL AND POLYCRYSTAL TEXTURING METHOD

CROSS-REFERENCE TO RELATED PATENT APPLICATION

This application is a continuation application of International Patent Application No. PCT/CN2015/097415, filed on Dec. 15, 2015, which itself claims priority to Chinese Patent Application No. CN201510656294.8 filed in China on Oct. 12, 2015. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to the field of silicon wafer texturing technology, and more particularly, to a monocrystal and polycrystal texturing method.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, the solar energy silicon cell technology has been continuously developed, the new technology emerges in endlessly, and the transfer efficiency of the silicon cell is continuously refreshed. Facing to the markets at home and abroad with more and more fierce competition, the elimination of the traditional technology becomes an inexorable trend. In the prior art, the preparation of the monocrystal texturing of the silicon wafer and the polycrystal texturing of the silicon wafer cannot be achieved by one device, and the device needs to be customized regarding to different texturing technologies, which leads to the increase of the cost.

Therefore, how to design a monocrystal and polycrystal texturing method that can respectively finish the monocrystal texturing and the polycrystal texturing by the one device is a technical problem urgently needing to be solved.

SUMMARY

In order to solve the defects existing in the prior art, the present invention provides a monocrystal and polycrystal texturing method, the device integrates the monocrystal texturing device in traditional technology with the polycrystal texturing device, so that the monocrystal texturing and the polycrystal texturing can be realized by one device, and the device has the advantages of reducing the use amount of chemicals, increasing the capacity and facilitating the realization of automation.

The technical solution used by the present invention is to design a monocrystal and polycrystal texturing method, which comprises: step 1: dipping the silicon wafer in an acid liquid, wherein the acid liquid reacts with the surface of the silicon wafer to conduct acid corrosion;

step 2: washing the silicon wafer after acid corrosion by water and then drying the silicon wafer;

step 3: uniformly spreading an alkali liquid on the silicon wafer, wherein the alkali liquid reacts with the surface of the silicon wafer;

step 4: washing the silicon wafer after alkali corrosion by water;

step 5: dipping the silicon wafer in an alkali solution for alkali washing;

step 6: washing the silicon wafer by water;

step 7: washing the silicon wafer by an acid solution; and step 8: washing the silicon wafer after acid washing by water and then drying the silicon wafer.

Steps 1 to 8 are conducted during monocrystal texturing, steps 1 to 2 and steps 5 to 8 are conducted during polycrystal texturing.

Wherein, the silicon wafer can be placed in the acid solution for acid washing in step 7, or the acid solution is uniformly spread on the silicon wafer for acid washing.

The acid liquid in step 1 during monocrystal texturing is a mixed solution of water, HCl and $H_2O_2$ with a ratio of 346:100:100. The acid liquid in step 1 during polycrystal texturing is a mixed solution of water, $HNO_3$ and HF with a ratio of 181:300:65, and the temperature of the acid liquid in step 1 is 8 to 10° C.

The alkali liquid in step 3 is a mixed solution of water, KOH and monocrystal texturing additive with a ratio of 380:40:4, and the temperature of the alkali liquid is 80° C.

The solution in step 5 during monocrystal texturing is a mixed solution of water, KOH and $H_2O_2$ with a ratio of 370:10:30. The alkali solution in step 5 during polycrystal texturing is a mixed solution of water and KOH with a ratio of 430:5.

The acid solution in step 7 is a mixed solution of water, HCl and HF with a ratio of 300:80:40.

The temperature of the alkali liquid in step 3 during monocrystal texturing is 80° C.; and the temperature of the acid liquid in step 1 during polycrystal texturing is 8 to 10° C. The normal temperature can be applied to other solutions not marked with the temperature.

Compared with the prior art, the present invention conducts reasonable combination and arrangement to the monocrystal texturing technology steps and the polycrystal texturing technology steps according to the technology property of the monocrystal texturing and the polycrystal texturing, so that the monocrystal and polycrystal texturing technology can be conducted by the same device, the device only needs to open or close corresponding stations according to the difference of the monocrystal or poly crystal texturing.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
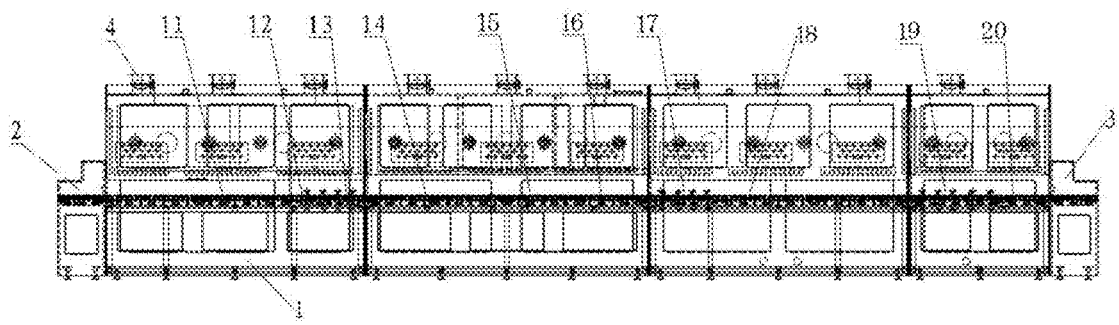
FIG. 1 is an overall structure diagram of the device used by the present invention.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
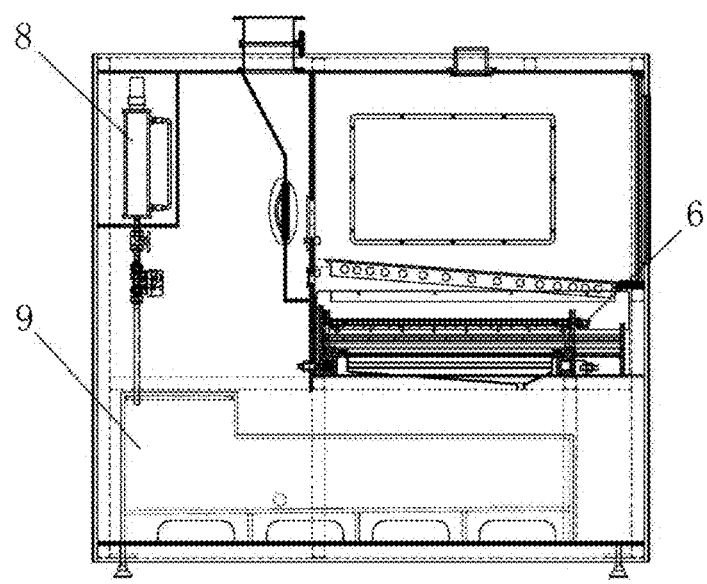
FIG. 2 is a structure diagram of a side face of the device used by the present invention.

As shown in FIGS. 1 and 2, a monocrystal and polycrystal texturing method provided by the present invention can realize the monocrystal texturing and the polycrystal texturing by a same device, the device comprises a device body 1, various stations arranged in the device body in sequence from front to back, a transmission device 6 and a control system, two ends of the device are provided with a feeding platform 2 and a laying-off platform 3, and the top of the device body 1 is provided with an air draft system 4. The various stations are respectively a dipping acid texturing station 11, a spray washing station 12, a drying station 13, a spray alkali texturing station 14, a second spray washing station 15, a dipping alkali treatment station 16, a third spray washing station 17, an acid treatment station 18, a fourth spray washing station 19 and a second drying station 20 arranged in sequence. The silicon wafer 7 is placed on the feeding platform 2 in a level manner in using, the feeding platform 2 has an automatic normalization device and a dropping protection device, the entering amount of the wafer is automatically detected by a photoelectric sensor, the prompt function of wafer connection warning is provided, the silicon wafer is transmitted to the various stations by the transmission device 6 in sequence, and then is received after arriving the laying-off station 3.

Wherein, the working status of the various stations is controlled by the control system, in the treatment technology of the silicon wafer, for example, the dipping treatment station generally uses a power pump to treat the silicon wafer 7 by pumping liquid, and when the power pump does not work, the liquid cannot be contacted with the silicon wafer 7, and the silicon wafer is not treated at this station. Therefore, the control system actually controls the power pump or other power elements of the various stations, when the power element does not work, the station is in a closing status, the silicon wafer 7 passes through the station by the transmission device 6 without reaction, and when the power element works, the station is in an opening status, and the silicon wafer 7 passes through the station by the transmission device 6 with reaction. The control system can flexibly select the station needing to be opened according to the difference of technologies including the monocrystal or polycrystal texturing, so as to achieve the purpose that the polycrystal acid texturing, the monocrystal alkali texturing, the monocrystal acid texturing and the monocrystal alkali texturing can be conducted by one device.

Figure 3:
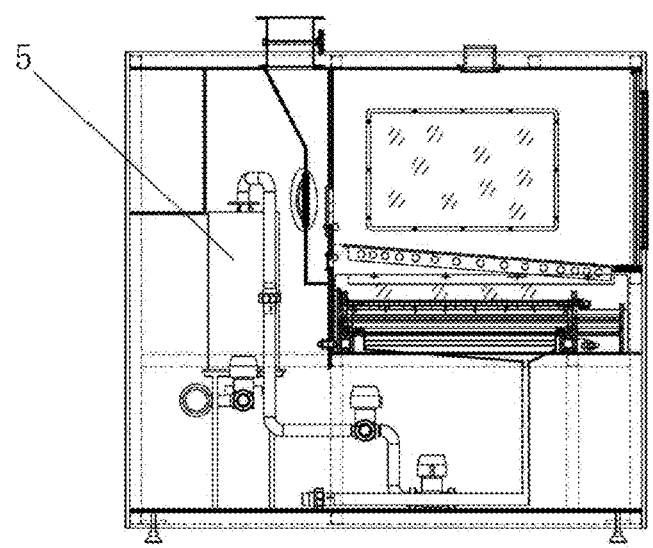
FIG. 3 is a structure diagram of another side face of the device used by the present invention.

As shown in FIG. 3, since the temperature of a treatment liquid required during the alkali texturing of the monocrystal or polycrystal texturing is different, the spray alkali texturing station 14 is also connected with the heating device 5, the working status of the heating device 5 is also controlled by the control system, and in the actual use, the heating device can be installed in a circulation pipeline, and can also be installed in a sub-slot.

The monocrystal and polycrystal texturing method of the present invention is introduced in detail hereinafter, which comprises the following steps:

step 1: transmitting a silicon wafer 7 to various stations by the transmission device 6, and dipping the silicon wafer in an acid liquid when the silicon wafer passes through the dipping acid texturing station 11, wherein the acid liquid reacts with the surface of the silicon wafer 7 to conduct acid corrosion;

step 2: washing the silicon wafer 7 after acid corrosion by water and then drying the silicon wafer when the silicon wafer passes through the first spray washing station 12 and the first drying station 13;

step 3: uniformly spreading an alkali liquid on the silicon wafer 7 by the spray alkali texturing station 14 when the silicon wafer 7 passes through the spray alkali texturing station 14, wherein the alkali liquid reacts with the surface of the silicon wafer 7 to conduct alkali corrosion;

step 4: washing the silicon wafer 7 after alkali corrosion by water when the silicon wafer 7 passes through the second spray washing station 15;

step 5: dipping the silicon wafer 7 in an alkali solution for alkali washing when the silicon wafer 7 passes through the dipping alkali treatment station 16;

step 6: washing the silicon wafer 7 by water when the silicon wafer passes through the third spray washing station 17;

step 7: washing the silicon wafer 7 by an acid solution when the silicon wafer 7 passes through the acid treatment station 18; and step 8: washing the silicon wafer 7 after acid washing by water and then drying the silicon wafer when the silicon wafer passes through the fourth spray washing station 19 and the second drying station 20.

Steps 1 to 8 are conducted during monocrystal texturing.

The specific reaction process of the monocrystal texturing is as follows:

step 1: dipping the silicon wafer in the acid liquid to conduct pre-washing, wherein the used acid liquid is a mixed solution of water, HCl and $H_2O_2$ with a ratio of 346:100:100, and the temperature of the acid liquid is normal temperature;

step 2: washing the silicon wafer after acid corrosion by water and then drying the silicon wafer;

step 3: uniformly spreading an alkali liquid on the silicon wafer, wherein the used alkali liquid is a mixed solution of water, KOH and monocrystal texturing additive with a ratio of 380:40:4, the temperature of the alkali liquid is 80° C., and the alkali liquid reacts with the surface of the silicon wafer to conduct alkali corrosion;

step 4: washing the silicon wafer after alkali corrosion by water;

step 5: placing the silicon water in alkali solution for alkali washing, which is used to eliminate the organic matter on the silicon wafer, wherein the alkali solution is a mixed solution of water, KOH and $H_2O_2$ with a ratio of 370:10:30, and the temperature of the alkali solution is normal temperature;

step 6: washing the silicon wafer by water;

step 7: washing the silicon wafer by acid solution, wherein the acid solution is a mixed solution of water, HCl and HF with a ratio of 300:80:40; and step 8: washing the silicon wafer after acid washing by water and then drying the silicon wafer.

Steps 1 to 2 and steps 5 to 8 are conducted during polycrystal texturing, and when the transmission device 7 transmits the silicon wafer 7, the spray alkali texturing station 14 and the second spray washing station 15 do not work, the steps are as follows:

step 1: dipping the silicon wafer in the acid liquid to conduct polycrystal texturing, wherein the used acid liquid is a mixed solution of water, $HNO_3$ and HF with a ratio of 181:300:65, and the temperature of the acid liquid is 8 to 10° C.;

step 2: washing the silicon wafer after acid corrosion by water and then drying the silicon wafer;

step 3: screening the circulation system of the spray alkali texturing station, and only opening the transmission device to transmit the silicon wafer;

step 4: screening the circulation system of the second spray washing station, and only opening the transmission device to transmit the silicon wafer;

step 5: placing the silicon water in alkali solution for alkali washing, wherein the alkali solution is a mixed solution of water and KOH with a ratio of 430:5, and the temperature of the alkali solution is normal temperature;

step 6: washing the silicon wafer by water;

step 7: washing the silicon wafer by acid solution, wherein the acid solution is a mixed solution of water, HCl and HF with a ratio of 300:80:40; and step 8: washing the silicon wafer after acid washing by water and then drying the silicon wafer.

The present invention combines the follow-up washing and drying technologies of the monocrystal and polycrystal, this part of station can be commonly used during the monocrystal and polycrystal texturing, and the technology process is more compact. Wherein, the silicon wafer 7 can be placed in the acid solution for acid washing in step 7, or the acid solution is uniformly spread on the silicon wafer 7 for acid washing.

The acid liquid in step 1 is a mixed solution of water, $HNO_3$ and HF with a ratio of 181:300:65, and the temperature of the acid liquid in step 1 is 8 to 10° C. The alkali liquid in step 3 is a mixed solution of water, KOH and monocrystal texturing additive with a ratio of 380:40:4, and the temperature of the alkali liquid in step 3 is 80° C. The alkali solution in step 5 is a mixed solution of water and KOH with a ratio of 430:5. The acid solution in step 7 is a mixed solution of water, HCl and HF with a ratio of 301:100:40.

Specifically, the transmission device 6 comprises a longitudinally and uniformly arranged delivery roll 61 and an electric element driving the delivery roll 61 to rotate, the slot of the various stations is arranged under the delivery roll 61, and when the delivery roll 61 is rotated, the silicon wafer 7 continuously moves forward to pass through the various stations.

Figure 4:
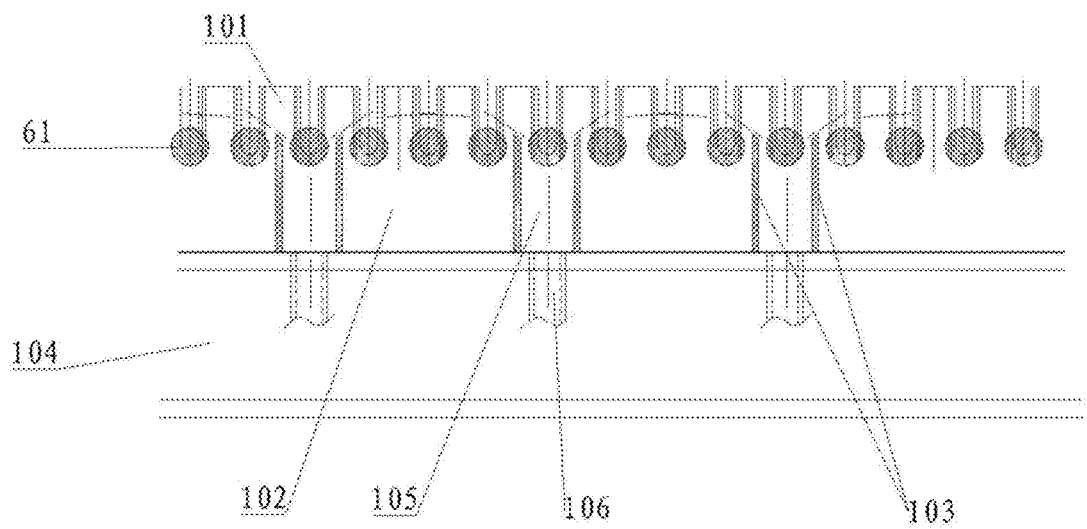
FIG. 4 is a structure diagram of a dipping acid texturing station in the device used by the present invention.

As shown in FIG. 4, the dipping acid texturing station 11 comprises an acid texturing slot 101, multiple pairs of separation plates 103 separating the acid texturing slot 101 into multiple working liquid chambers 102, an acid texturing pump for pumping the acid texturing liquid into the working liquid chambers 102, and an acid texturing sub-slot 104 for collecting the acid texturing liquid in the acid texturing slot 101; each pair of separation plates 103 are spaced to form a cushion chamber 105 for overflow cycle, and the bottom of the cushion chamber 105 is provided with an output port 106 connected with the acid texturing sub-slot 104. The top surface of the delivery roll 61 at the dipping acid texturing station holds the line with the top surface of the acid texturing slot 101, or is a litter higher than the acid texturing slot 101. The function of the dipping acid texturing station is to conduct the acid liquid suede treatment, when the silicon wafer 7 is transmitted to pass through the acid texturing slot 101 in a level manner, the acid texturing pump pumps the acid texturing liquid in the working liquid chambers 102, under the power effect of the pump, the acid treatment liquid is higher than the delivery roll 61 to immerse the silicon wafer 7, the silicon wafer 7 and the acid liquid have a chemical reaction, the acid liquid flowing from the working liquid chambers 102 is collected in the sub-slot 104, and then is pumped from the acid texturing slot 101 by the acid texturing pump for recycling.

Figure 5:
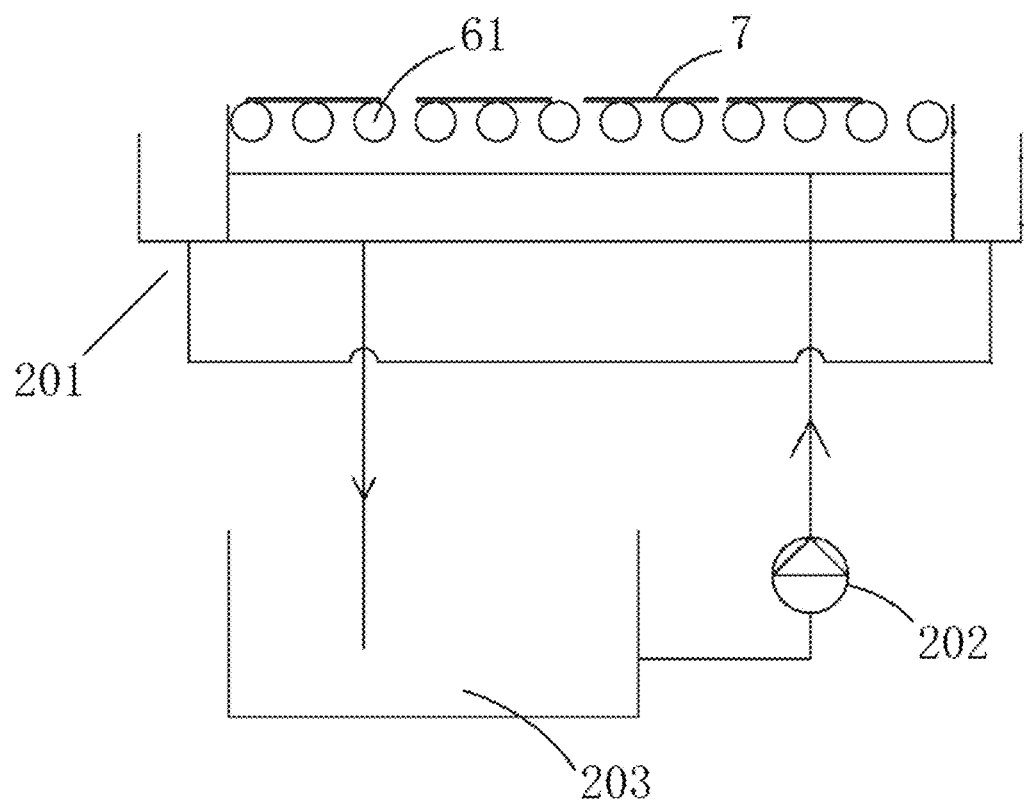
FIG. 5 is a structure diagram of a spray washing station in the device used by the present invention.

As shown in FIG. 5, all the four spray washing stations comprise: a spray washing slot 201, a spray header arranged above the spray washing slot 201, and a water pump 202 for pumping the water washing liquid into the spray header. The function of the spray washing station is to eliminate the residual medical liquid on the surface of the silicon wafer 7, the silicon wafer 7 is transmitted in a level manner, and the spray header washes the silicon wafer 7 up and down in a certain angle. Wherein, the first spray washing station 12 is not provided with a spray washing sub-slot, the water of the spray washing station is waster water to be discharged directly, other second, third and fourth spray washing stations set in sequence are all provided with a spray washing sub-slot 203 for collecting the water washing liquid in the spray washing slot 201, and then the water is supplied to the spray pipe again by the water pump 202 to save water.

Both the two drying stations comprise a hot-air blower for providing an air source and a filter for filtering the air source, and the hot-air blower dries the silicon wafer in an up-and-down air cutting manner.

Figure 6:
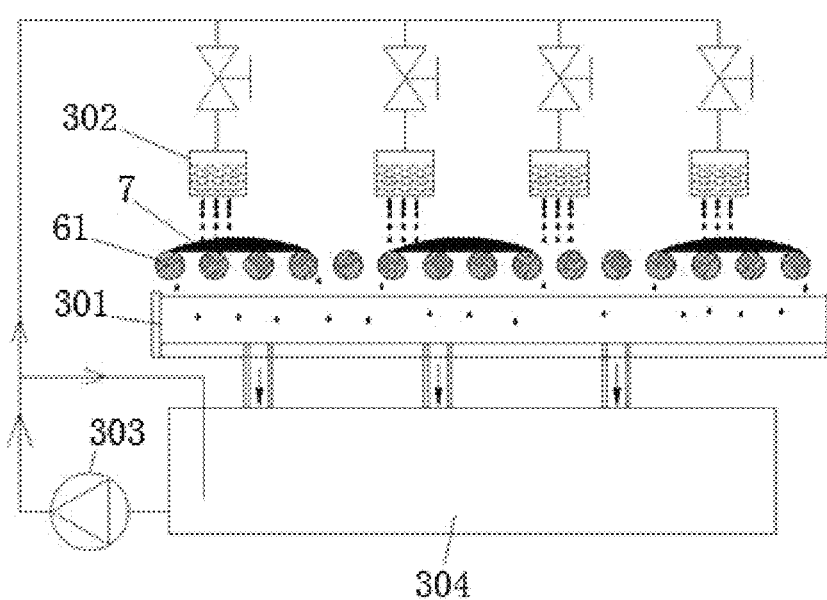
FIG. 6 is a structure diagram of a spray alkali texturing station in the device used by the present invention.

As shown in FIG. 6, the spray alkali texturing station 14 comprises an alkali texturing slot 301, a spray alkali liquid box 302 arranged above the alkali texturing slot 301, an alkali texturing pump 303 for pumping the alkali texturing liquid into the spray alkali liquid box 302, and an alkali texturing sub-slot 304 for collecting the alkali texturing liquid in the alkali texturing slot 301. The alkali texturing liquid is pumped to the spray alkali liquid box 302 above the silicon wafer 7 to the upper surface of the silicon wafer 7 to conduct the chemical treatment, and the function of the spray alkali texturing is to conduct alkali texturing to the silicon wafer 7. When the suede of the monocrystal silicon wafer is prepared, the high-temperature treatment is needed, the medical liquid is heated by the heating device 5 and is supplied to the spray alkali liquid box 302 by the pump, the alkali texturing liquid is sprayed on the upper surface of the silicon wafer 7 to effectively increase the treatment quality of the surface of the silicon wafer, the overflowing alkali texturing liquid is collected to the alkali texturing sub-slot 304, and then is supplied to the alkali texturing slot 301 by the alkali texturing pump 303 for recycling.

The dipping alkali treatment station 16 comprises an alkali treatment slot, multiple pairs of separation plates separating the alkali treatment slot into multiple working liquid chambers, an alkali treatment pump for pumping the alkali treatment liquid into the working liquid chambers, and an alkali treatment sub-slot for collecting the alkali treatment liquid in the alkali treatment slot, each pair of separation plates are spaced to form a cushion chamber for overflow cycle, and the bottom of the cushion chamber is provided with an output port connected with the alkali treatment sub-slot. The function of the dipping alkali treatment station is to eliminate the organic matter of the technology of front section, porous silicon and acid-base neutralization, the structure thereof is the same as the structure of the dipping acid texturing station, the working process of the station is also similar, and the unnecessary details are not given.

The function of the acid treatment station 18 is to eliminate phosphorosilicate glass and metal ion on the front face of the silicon wafer to make preparation for the next process. There are two feasible structures, the first is the dipping treatment, the acid treatment station comprises an acid treatment slot, multiple pairs of separation plates separating the acid treatment slot into multiple working liquid chambers, an acid treatment pump for pumping the acid treatment liquid into the working liquid chambers, and an acid treatment sub-slot for collecting the alkali treatment liquid in the acid treatment slot, each pair of separation plates are spaced to form a cushion chamber for overflow cycle, and the bottom of the cushion chamber is provided with an output port connected with the acid treatment sub-slot. The structure of the dipping treatment is the same as the dipping acid texturing station, the working process of the station is also similar, and the unnecessary details are not given.

The second is the spray treatment, and the acid treatment station comprises an acid treatment slot, a spray acid liquid box arranged above the acid treatment slot, an acid treatment pump for pumping the acid treatment liquid into the spray acid liquid box, and an acid treatment sub-slot for collecting the alkali treatment liquid in the acid treatment slot. The structure of the spray treatment is the same as the dipping alkali texturing station, the working process of the station is also similar, and the unnecessary details are not given.

The contents above are basic composition and structure of the various stations.

When the silicon wafer 7 is placed in the acid solution for acid washing in step 7, the first structure is used in the acid treatment station 18. When the acid solution is uniformly spread on the silicon wafer 7 for acid washing in step 7, the second structure is used in the acid treatment station 18.

In the embodiment, the heating device 5 in the spray alkali texturing station 14 comprises: a heater installed in the alkali texturing sub-slot 304 or a circulation pipeline and a temperature detector, and both the heater and the temperature detector are connected with the control system.

Preferably, the dipping acid texturing station 11, the spray alkali texturing station 14, the dipping alkali treatment station 16 and the acid treatment station 18 are all connected with an automatic liquid compensation system 8. The water, alkali or acid is supplemented to various stations at the interval of a certain quantity of silicon wafer in the automatic liquid compensation system 8 according to the quantity of the silicon wafer counted by the feeding platform 2, so that the solution volume and ratio of various stations are kept.

The description above is only the preferable embodiment of the present invention, and is not used to limit the present invention. Any modification, equal replacement and improvement made in the spirit and principle of the present invention shall fall in the protection scope of the present invention.

What is claimed is:

1. A monocrystal and polycrystal texturing method, wherein the monocrystal and polycrystal texturing method realizes monocrystal texturing and polycrystal texturing by a same device, the device is composed of a device body, various stations arranged in the device body in sequence from front to back, a transmission device and a control system, the various stations are respectively a dipping acid texturing station, a first spray washing station, a first drying station, a spray alkali texturing station, a second spray washing station, a dipping alkali treatment station, a third spray washing station, an acid treatment station, a fourth spray washing station and a second drying station arranged in sequence;

wherein, the monocrystal texturing method comprises:
step 1: transmitting a silicon wafer to various stations by the transmission device, and dipping the silicon wafer in an acid liquid when the silicon wafer passes through the dipping acid texturing station, wherein the acid liquid reacts with the surface of the silicon wafer to conduct acid corrosion, wherein the acid liquid during monocrystal texturing is a mixed solution of water, HCl and $H_2O_2$ with a ratio of 346:100:100 and wherein the acid liquid during polycrystal texturing is a mixed solution of water, $HNO_3$ and HF with a ratio of 181:300:65;

step 2: washing the silicon wafer after acid corrosion by water and then drying the silicon wafer when the silicon wafer passes through the first spray washing station and the first drying station;

step 3: uniformly spreading an alkali liquid on the silicon wafer by the spray alkali texturing station when the silicon wafer passes through the spray alkali texturing station, wherein the alkali liquid reacts with the surface of the silicon wafer to conduct alkali corrosion, and wherein the alkali liquid in is a mixed solution of water, KOH and monocrystal texturing additive with a ratio of 380:40:4;

step 4: washing the silicon wafer after alkali corrosion by water when the silicon wafer passes through the second spray washing station;

step 5: dipping the silicon wafer in an alkali solution for alkali washing when the silicon wafer passes through the dipping alkali treatment station;

step 6: washing the silicon wafer by water when the silicon wafer passes through the third spray washing station;

step 7: washing the silicon wafer by an acid solution when the silicon wafer passes through the acid treatment station, wherein the silicon wafer can be placed in the acid solution for acid washing, or wherein the acid solution is uniformly spread on the silicon wafer for acid washing; and step 8: washing the silicon wafer after acid washing by water and then drying the silicon wafer when the silicon wafer passes through the fourth spray washing station and the second drying station;

wherein, steps 1 to 8 are conducted during monocrystal texturing, steps 1 to 2 and steps 5 to 8 are conducted during polycrystal texturing, and when the transmission device transmits the silicon wafer, the spray alkali texturing station and the second spray washing station do not work.

2. The monocrystal and polycrystal texturing method according to claim 1, wherein the solution in step 5 during monocrystal texturing is a mixed solution of water, KOH and $H_2O_2$ with a ratio of 370:10:30; and the alkali solution in step 5 during polycrystal texturing is a mixed solution of water and KOH with a ratio of 430:5.

3. The monocrystal and polycrystal texturing method according to claim 2, wherein the acid solution in step 7 is a mixed solution of water, HCl and HF with a ratio of 300:80:40.

4. The monocrystal and polycrystal texturing method according to claim 3, wherein the temperature of the alkali liquid in step 3 during monocrystal texturing is 80° C.; and the temperature of the acid liquid in step 1 during polycrystal texturing is 8 to 10° C.

5. The monocrystal and polycrystal texturing method according to claim 2, wherein the temperature of the alkali liquid in step 3 during monocrystal texturing is 80° C.; and the temperature of the acid liquid in step 1 during polycrystal texturing is 8 to 10° C.

6. The monocrystal and polycrystal texturing method according to claim 1, wherein the temperature of the alkali liquid in step 3 during monocrystal texturing is 80° C.; and the temperature of the acid liquid in step 1 during polycrystal texturing is 8 to 10° C.

* * * * *